United States Patent [19]
Tamura et al.

[11] Patent Number: 5,264,393
[45] Date of Patent: Nov. 23, 1993

[54] SOLID STATE IMAGE PICKUP DEVICE AND METHOD OF MANUFACTURING THE SAME

[75] Inventors: Hiroshi Tamura; Ryuji Kondo; Jin Murayama, all of Kanagawa; Hideki Kosaka; Noboru Maruyama, both of Nagano; Toshihiko Komatsu, Nagano, all of Japan

[73] Assignee: Fuji Photo Film Co., Ltd., Kanagawa, Japan

[21] Appl. No.: 842,652

[22] Filed: Feb. 27, 1992

Related U.S. Application Data

[60] Division of Ser. No. 576,047, Aug. 31, 1990, Pat. No. 5,122,861, which is a continuation-in-part of Ser. No. 436,987, Nov. 15, 1989, which is a continuation of Ser. No. 576,101, Aug. 31, 1990, Pat. No. 5,072,284.

[30] Foreign Application Priority Data

Nov. 25, 1988 [JP] Japan .................. 63-296334

[51] Int. Cl.$^5$ .................................. H01L 21/60
[52] U.S. Cl. ................... 437/209; 437/211; 437/214; 437/216; 437/220
[58] Field of Search ............. 437/209, 211, 213, 214, 437/220, 216, 219

[56] References Cited

U.S. PATENT DOCUMENTS

| | | | |
|---|---|---|---|
| 4,633,573 | 1/1987 | Scherer | 437/209 |
| 4,766,095 | 8/1988 | Hiroshi | 437/219 |
| 4,769,344 | 9/1988 | Sakai et al. | 437/216 |
| 4,874,722 | 10/1989 | Bednarz et al. | 437/214 |
| 4,999,319 | 3/1991 | Hamuno et al. | 437/211 |
| 5,070,041 | 12/1991 | Katayama et al. | 437/214 |

FOREIGN PATENT DOCUMENTS 10849 1/1983 Japan .................. 437/211

Primary Examiner—Brian E. Hearn
Assistant Examiner—Kevin M. Picardat
Attorney, Agent, or Firm—Sughrue, Mion, Zinn, Macpeak & Seas

[57] ABSTRACT

A solid state image pick-up device is provided in which a photoelectric conversion element is configured so that a light reception portion of the photoelectric conversion element is covered with a member of light transmissible glass. A frame, used as a package, is filled with synthetic resin by a potting method, and the synthetic resin is solidified so that the frame, the peripheral portions of the glass member, and the photoelectric conversion element are integrally combined with each other. By so doing, the light transmission property of the photoelectric element can be properly made, excellent moisture resistance can be obtained, and improved reliability of the device results. Further, a method of manufacturing the solid sate image pick-up device of the present invention is provided.

6 Claims, 5 Drawing Sheets

SOLID STATE IMAGE PICKUP DEVICE AND METHOD OF MANUFACTURING THE SAME

This is a divisional application of U.S. application No. 07/576,047 filed Aug. 31, 1990, now U.S. Pat. No. 5,122,861, which is a continuation-in-part of U.S. application No. 07/436,987 filed Nov. 15, 1989, which later became file-wrapper-continuation application No. 07/576,101 filed Aug. 31, 1990, now U.S. Pat. No. 5.072,284.

FIELD OF THE INVENTION

The present invention relates to a solid state image pickup device having a photoelectric converting function such as an image sensor, a phototransistor, etc. In particular, the present invention relates to a package structure suitable for a solid state image pickup device of this kind. Further, the present invention relates to a method of manufacturing a solid state image pickup device.

BACKGROUND OF THE INVENTION

As video appliances have become popular, demand has increased for image sensors such as CCDs, MOS CCDs, etc., of solid state image pickup devices. Conventionally, image sensors have been generally packaged using ceramics offering superior moisture resistance.

As the demand has increased as described above, however, image sensors have come to be used in a variety of configurations, and further it has become necessary to make the image sensor compact and lightweight. In order to satisfy the demand, therefore, and further in compliance with cost pressures, plastic packages have been used in place of ceramic packages.

Where plastic packages have been used for solid state image pickup devices having a large light reception portion such as image sensors, a unique problem must be solved.

Specifically, a solid state image-pickup device such as an image sensor, a phototransistor, a photodiode, or the like, performs photoelectric conversion on the basis of incident light, and the light reception portion thereof is transparently or light-transmissibly packaged.

In packaging the light reception portion with plastics, it is necessary that the package surface be smooth over the whole surface. If the package surface is not smooth or is damaged, scattering reflection of light occurs which scatters the light transmission.

Further, in pouring the synthetic resin, if dust is mixed in or if air bubbles occur, the quantity of light transmission is deteriorated. The scattering and decreased quantity of light transmission may be factors in disadvantageously reducing the sensitivity of the image sensor.

Moreover, it is necessary to improve moisture resistance in the device, a problem common to all semiconductor devices.

In the case where a plastic package is used in place of a ceramic package, it has been difficult to solve the problems described above.

Further, a photoelectric conversion element, including a bottom portion thereof, is integrally packaged with plastics except for its light reception portion. In this case, packaging often requires the use of a number of expensive metal molds.

While the above-mentioned package structure and package manufacturing method are suitable in producing a large quantity of photo semiconductor image pickup devices of the same structure, they require a number of expensive metal molds resulting in high production costs.

However, photo semiconductor image pickup devices are being used less than semiconductor devices such as amplifier circuits, comparators, etc. Further, as the performance, such as resolution, is improved, and as the devices are made smaller and lighter in weight, the devices have come to be used in a variety of ways.

By way of example, they have come to be used not only for video cameras but for medical appliances such as electronic endoscopes, and further for military devices.

In consideration of the increased use of such devices, it can be easily understood that not only is the function of such image sensors important but so are the external appearance and package structure thereof.

It is desirable to produce a small quantity and a variety of image sensors matched to the application for their intended use.

In the conventional structure and manufacturing method of image sensors, however, ceramics have not been suitable for the production of a small quantity and a variety of image sensors because a number of expensive metal molds are required.

Further, image sensors require a variety of clock pulses for image pickup, for pickup signal reading, and so on, and if functional improvement is desired (such as resolution) the number of external connection terminals for the supply of the clock pulses and for reading the pickup signal becomes large.

Conventional image sensors have a structure in which external connection terminals are provided on an outside surface of a package. Where the number of the terminals is increased, the intervals between the terminals becomes so narrow that an undesirable signal leakage, short circuit or erroneous mounting in soldering is likely to occur unless the package is large.

Further, good moisture resistance is required not only for image sensors but for all semiconductor devices, regardless of the package structure.

Also, it is important to have the photoelectric conversion element properly positioned in the lead-frame, and to position the glass plate properly with respect to the light receiving surface of the photo-electric conversion element.

Finally, if there is a gap between the photoelectric conversion element and the glass plate, the focal length to the object is undesirably increased according to the size of the gap.

SUMMARY OF THE INVENTION

A first object of the present invention is to provide a semiconductor device which offers good light transmitting properties an superior moisture resistance.

A second object of the present invention is to provide a semiconductor device which can be produced at low cost so that the device can be matched to its application.

In order to achieve the above first object, according to the present invention, the photoelectric conversion element is configured so that a light reception portion of the photoelectric conversion element is covered with a member of light transmissible glass. A frame which is used as a package is filled with synthetic resin by a potting method, and the synthetic resin is solidified so that, for example, the frame, the peripheral portions of the glass member and the photoelectric conversion element are integrally combined with each other.

That is, by covering the light reception portion of the photoelectric element with, for example, a plate-like glass member, the light transmission property of the photoelectric element can be made properly. Further, no gap is formed between the glass plate and the light receiving surface. Moreover, the scattering of light transmission and damage on the surface of the photoelectric element can be reduced. Furthermore, since the photoelectric conversion element, the glass member, and the frame of the package are integrally solidified with the synthetic resin, for example epoxy resin poured by the potting method, good moisture resistance can be obtained, resulting in improved reliability of the products.

In order the achieve the above second object, according to the present invention, the photoelectric conversion element is fixed on a copper-plated lamination plate of a predetermined size. A frame made of, for example, synthetic resin, is fixed on the periphery of the photoelectric conversion element, and the frame is closed with a light transmissible material at a portion corresponding to the light reception surface of the photoelectric conversion element.

According to the present invention having a structure as described above, the package can be formed without using a number of expensive metal molds because the package of the photoelectric conversion element comprises a copper-plated lamination plate, a frame formed by working synthetic resin material and metal or the like, and a light transmissible member.

Accordingly, the number of working steps in forming the package can be reduced so that producing costs can be reduced. Production costs are further reduced since it is unnecessary to use metal molds for ceramics Further, since the sizes of the copper-plated lamination plate and the frame can be easily and inexpensively changed in accordance with mounting status and device functions, the production of a small quantity and a variety of products can be easily realized.

Further, by forming a coating on the surface of the wiring substrate, moisture resistance can be improved.

DETAILED DESCRIPTION OF THE INVENTION

Figure 1:
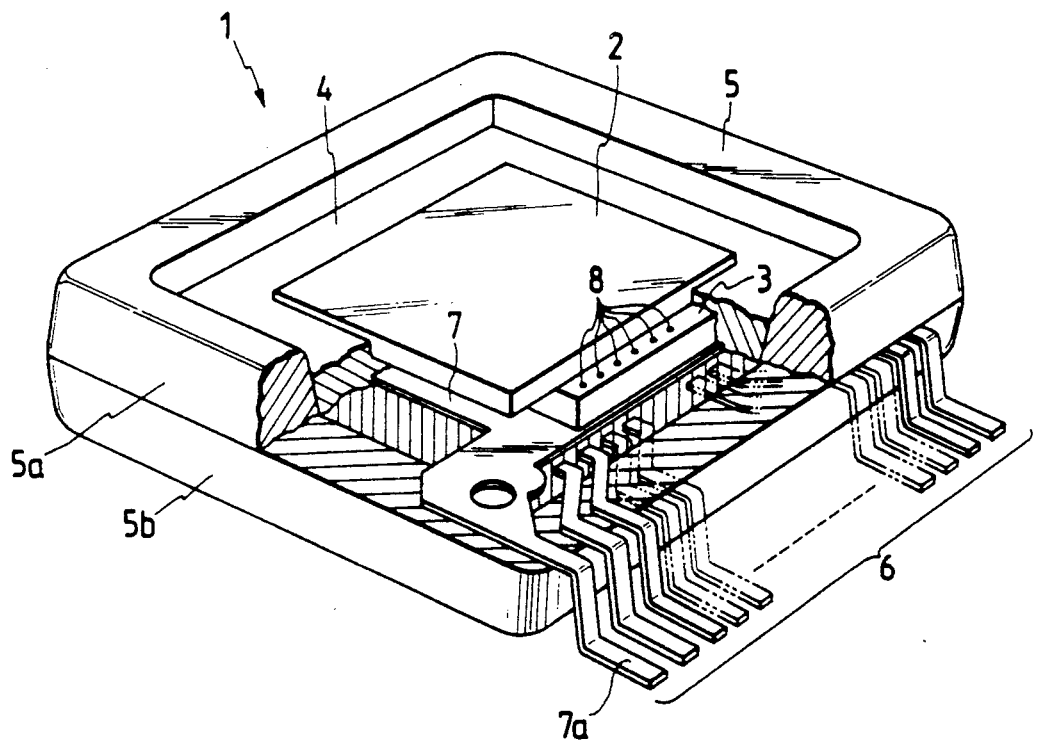
FIG. 1 is a partially cut-away perspective view showing the external appearance and structure of a first embodiment of the solid state image pickup device according to the present invention.

Referring to the drawings, embodiments of the semiconductor device according to the present invention are described as follows.

First, the external appearance of a solid state image pickup device 1 will be described with reference to FIGS. 1-3.

The solid state image pickup device 1 is an example of MOS-type image sensors and is provided in a package known in the art as a mini-flat package. The semiconductor device 1 has a light reception portion provided on its upper surface at a substantially central portion thereof, and is covered with a glass plate 2. The glass plate 2 is bonded at its lower surface to substantially the whole surface of a light reception surface of a photoelectric conversion element 3 through a transparent adhesive. The glass plate 2 is bonded at its outer periphery to synthetic resin 4 filled by the potting method and solidified.

The outer peripheral portion, having a high-level surface of the solid state image pickup device 1, is constituted by a frame 5 which is used as a package composed of an upper package 5a and a lower package 5b.

A number of leads 6 are external connection terminals of the photoelectric conversion element 3 and are led out from between the upper and lower packages 5a and 5b.

Although the lead portions outside the package and the lead portions inside the package are called outer leads and inner leads, respectively, by those skilled in the art, all the leads will be simply referred to as "leads" in this embodiment for convenience.

The inside structure of the semiconductor device 1 is described as follows. The lower surface of the photoelectric conversion element 3 is fixedly bonded to a tab hung lead 7 at a substantially central portion in the package. This bonding is performed so as to be electrically conductive, and a lead 7a of the tab hung lead 7 is maintained at a predetermined potential to thereby ensure stable operation. Further, bonding pads 8 of the photoelectric conversion element 3, in other words, the external connection terminals, are respectively connected to the top ends of the respective leads 6 through bonding wires 9 as shown in FIGS. 2 and 3.

The glass plate 2 is bonded onto the upper portion of the thus fixed photoelectric conversion element 3 as described above. At this time, the four corners of the glass plate 2 are prevented from being displaced transversely by positioning members 10.

Figure 3:
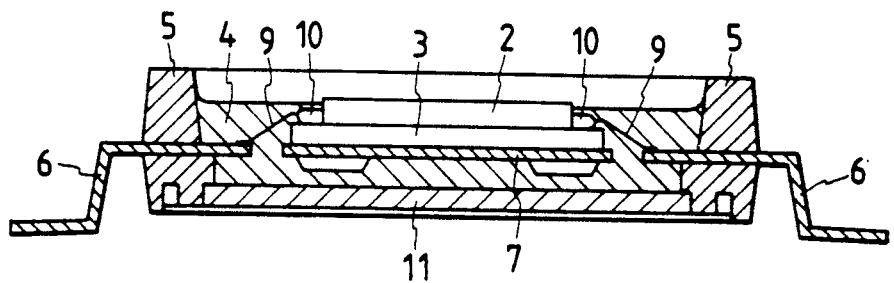
FIG. 3 is a sectional view of a main portion of the solid state image pickup device of FIG. 1.

As shown in FIG. 3, the lower portion of the package 5 is covered with a plate-like cover 11. The cover 11 prevents synthetic resin 4 from flowing out when filling of the synthetic resin 4 is carried out by the potting method.

When the packages 5a and 5b, the photoelectric conversion element 3, the glass plate 2, the cover 11, etc have been integrated with each other, and the wire bonding has been performed, the photoelectric conversion element 3 is as though it is suspended at the central portion of the box-shaped body. In this state, the upper space of the box-shaped body is open, and is filled with the synthetic resin 4 in a liquid phase through the opening of the upper space by the potting method.

Being in a liquid phase during potting, the synthetic resin 4 permeates the space in the box-shaped body so that even fine spaces are filled with synthetic resin. However, since the potting method is not a press forming method, the force exerted on the fine bonding wires is so small that the possibility of undesired contact due to so-called wire flow can be reduced.

The materials of the various members constituting the solid state image pickup device 1 are described hereunder.

Taking the size of the package and the number of the lead terminals into consideration, a 42-alloy material having a plate thickness of 0.15 mm was used for the lead frame which became the leads 6 and the tab hung lead 7, and the whole surface of the lead frame was plated with 4 μm thick Ag.

As to the package 5, the material used requires consideration of at least the dimensional reliability and accuracy, the heat resistance in the assembling step, the heat resistance in mounting the solid state image pickup device 1 on the printed wiring substrate (not shown), the coefficient of thermal expansion, and the mechanical strength.

The synthetic resin used in this embodiment for molding the package 5 and the cover 11 was VECTRA-A-410 made by POLYPLASTICS Co. Epoxy resin in a liquid phase having good-adhesive qualities was used as the synthetic resin 4 added by the potting method.

In the solid state image pickup device 1 having a configuration as described above, since the glass plate 2 offers superior light transmission and has high surface hardness, the quantity of light received by the photoelectric conversion element 3 is even so that it is possible to carry out a photoelectric conversion operation with less sensitivity to scattering. Since the outer periphery and a part of the lower side surface of the glass plate 2 are integrated with epoxy resin having good adhesive qualities, moisture will hardly penetrate to the photoelectric conversion element 3 along the boundary surface between the glass plate 2 and the epoxy resin 4 is formed. Accordingly, the moisture resistance of the whole solid state image pickup device is improved. Further, not only because the package is a mini-flat package, but also because the leads are formed in a bent shape for facilitating solder dipping, the mounting of the solid state image pickup semiconductor device 1 onto a wiring substrate is facilitated so that the number of working steps can be reduced.

More noticeably, because the four corners of the glass plate 2 are positionally restricted by the positioning members, defective products due to displacement are reduced, and the potting process is improved.

Although the embodiment of the present invention has been described above, the present invention is not limited to the described embodiment, but the embodiment can be modified in a variety of ways.

For example the synthetic resin filled by the potting method may be colorless and transparent, or may be black in color. In the case of colored synthetic resin, light received through diffraction can be reduced.

Further, a color filter may be used in place of the glass plate to thereby forming a color image pickup.

Further, a prism or the like may be used in place of the glass plate.

The present invention is widely applicable to any other solid state image pickup device in addition the image sensor described above. For example, the invention can be applied to semiconductor devices for performing photoelectric conversion such as phototransistors.

As described above, in the first embodiment of the solid state image pickup device according to the present invention, the light reception portion of the photoelectric conversion element is covered with glass, and the periphery of the glass and the frame which is used as a package are integrally fixed to each other with the synthetic resin filled by the potting method.

In the configuration described above, since glass is used which offers superior light transmission characteristics, the degree of transmission of light incident on the light reception portion can be made suitable. In other words, the transmission of light incident on the light reception portion can be made uniform, so that it is possible to perform photoelectric conversion having less sensitivity to scattering.

Further, since the adhesive characteristic at the boundary surface between the glass and the synthetic resin is superior, no moisture invading path is formed on the boundary surface. Accordingly, the permeation of water and humidity is reduced, and moisture resistance is improved.

Next, the structure for positioning the photoelectric conversion element 3 and the glass plate 2 will be described.

Figure 2:
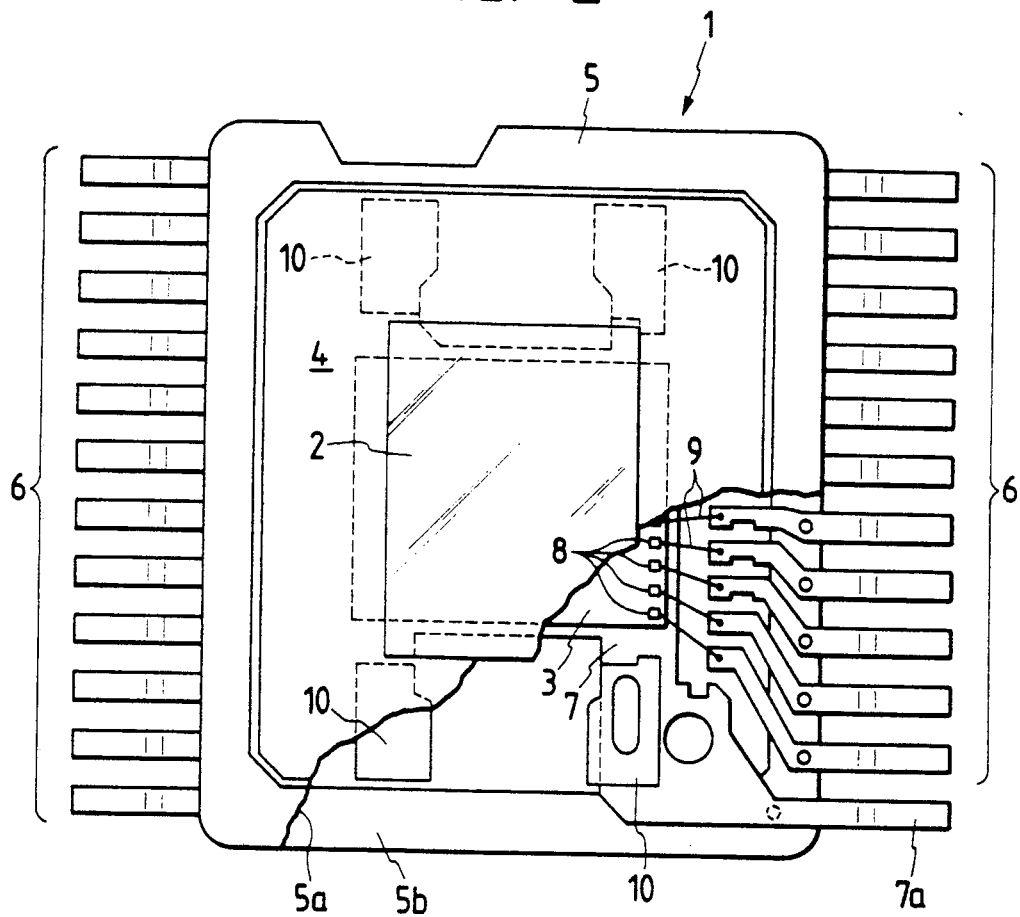
FIG. 2 is a partially cut-away plan view showing the positional relationship among the respective members of the solid state image pickup device of FIG. 1.
Figure 7:
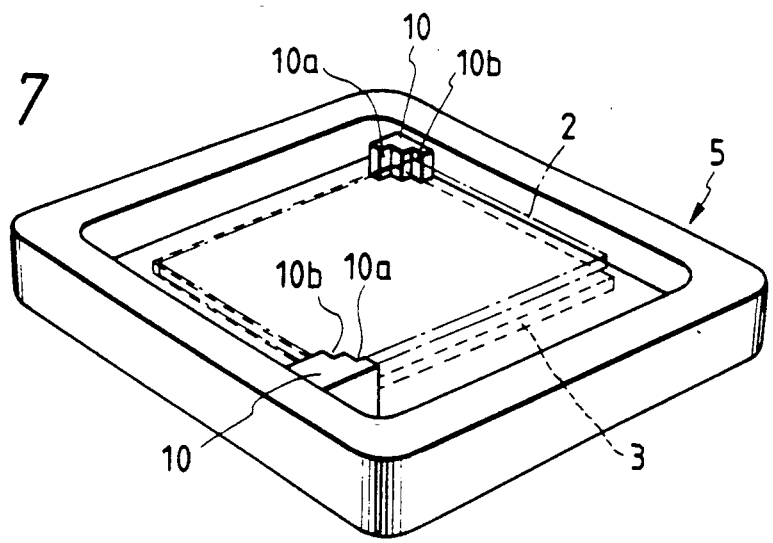
FIG. 7 is a perspective view showing the frame of the semiconductor device of FIG. 1.

As shown in FIGS. 2 and 7, positioning members 10 are provided on the inner walls of the frame 5 which are opposite to each other.

Each of the positioning members 10 has first and second steps 10a and 10b at its one end, as shown in FIG. 7. The second steps 10b are engaged with the diagonal corners of the glass plate 2, to position the latter.

The photo-electric conversion element 3 can be fixedly positioned merely by engaging its diagonal corners with the first steps 10a. This engagement positively prevents the lateral displacement of the photo-electric conversion element 3.

Similarly, the glass plate 2 can be fixedly positioned merely by engaging its diagonal corners with the second steps 10b. This engagement determines the position of the glass plate 2 with respect to the photo-electric conversion element 3, and prevents the lateral movement of the glass plate 2.

Thus, in manufacturing the image sensor 1, the lead frame and the frame 5 are automatically positioned with high precision.

The configurations and dimensions of the lead frame, the photo-electric conversion element 3 fixed mounted on the lead frame, and the glass plate 2 positioned on the photo-electric conversion element 3 are determined when designed.

That is, referring to the configurations and dimensions of these components, the positioning members 10 are provided and the first and second steps 10a and 10b are formed. As a result, the position of the glass plate 2 with respect to the lead frame can be determined with ease, and the unwanted displacement of the glass plate 2 can be prevented positively.

The image sensor, to which the technical concept of the invention is applied, has been described. The image sensor thus constructed has the following outstanding characteristics:

The glass plate 2 is bonded to the light receiving surface of the photo-electric conversion element 3, and the glass plate thus bonded forms a part of the package. Therefore, in practice, for instance a lens can be set close to the surface of the glass plate 2; that is, the focal length to the object can be reduced as much.

As a result, an image pick-up operation with high magnification can be carried out. Thus, the image sensor can be widely applied not only to electronic still cameras with VTR camera but also to devices such as electronic endoscopes which need close-up operations.

As shown in FIG. 3, the upper surface of the frame 5 is different as much as h in height from that of the glass plate 2. Hence, even if the image sensor 1 is set upside down when installed, the surface is scarcely brought into contact with other objects; that is, it is scarcely scratched. As a result, the probability is decreased that the glass plate is broken or light is irregularly reflected; that is; the reliability of the image sensor 1 is improved.

The provision of the positioning members 10 makes it possible to position the glass plate 2 and the photo-electric conversion element 3 with ease. In addition, the following significant effect is obtained.

Importantly, the area of the glass plate 2 need not be large when compare-d with the area of the light receiving surface of the photoelectric conversion element 3.

Consider the case where the positioning members 10 are not employed, and the glass plate 2 is positioned by using the frame 5. In this case, the light transmitting path is extended laterally along the light receiving surface, and therefore light refracted is liable to enter through the light receiving surface, as a result of which the image pickup data obtained through photoelectric conversion suffers from increased noise. In addition, the glass plate may be broken, or its surface may be scratched.

Further, consider the case where the glass plate 2 and the light receiving surface are substantially equal to each other in area, whereby the glass plate 2 is positioned in place by being bonded to the light receiving surface.

This case suffers from the following difficulty. If the glass plate 2 is not accurately positioned when bonded, then the edges of the glass plate 2 are set excessively close to the bonding pads. As a result, the capillary used to perform the wire bonding operation is brought into contact with the edges of the glass plate; that is, it is impossible to carry out the wire bonding operation.

The above-described difficulties can be eliminated by the provision of the positioning members 10.

Figure 8:
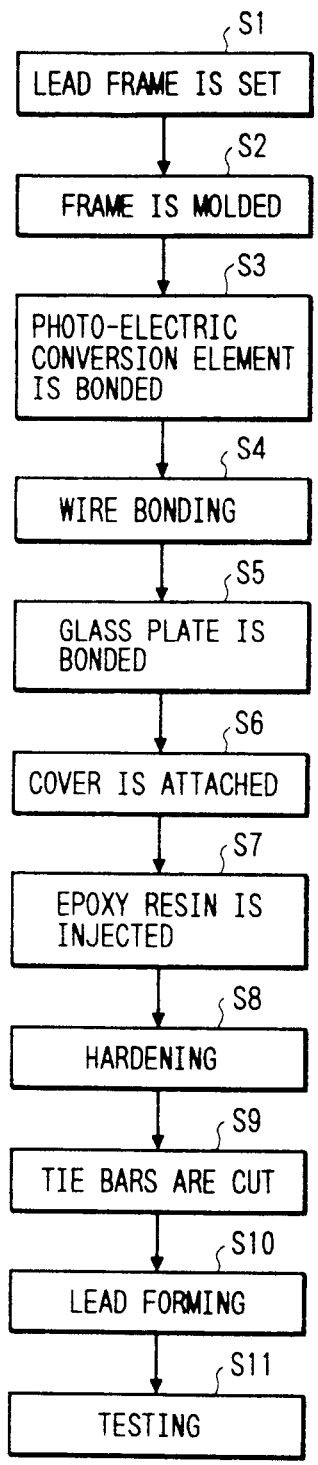
FIGS. 8 and 9 are flow charts showing methods of manufacturing the semiconductor device.
Figure 9:
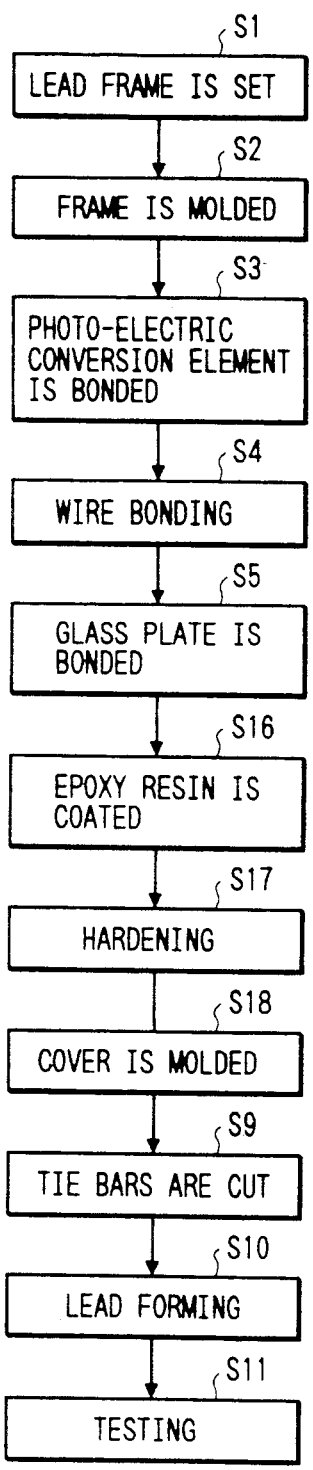

A method of manufacturing the above-described image sensor 1 will be described with reference to FIGS. 8 through 10.

First, a first method of manufacturing the image sensor will be described with reference to FIG. 8.

In manufacturing the image sensor, in Step S1 a lead frame is set in a metal mold (not shown) for forming the frame 5.

Then, thermoplastic resin such as ABS resin or "Vectra" (Phonetic) resin for molding the frame 5 is injected into the mold.

Thereafter, in Step S2, the frame 5 is molded. Then, in step S3, the photo-electric conversion element 3 is bonded to the lead frame.

In Step S4, the wire bonding operation is carried out by using a gold (Au) wire. And in Step S5, the glass plate 2 is bonded to the light receiving surface of the photo-electric conversion element with UV resin. In this operation, the photoelectric conversion element 3 and the glass plate 2 are positioned in the above-described manner.

After the glass plate 2 has been bonded to the photoelectric conversion element 3, the lower opening of the frame 5 is covered with a cover 11 in Step S6 so as to prevent the thermosetting resin such as epoxy resin injected in the following step from flowing out of the frame.

Until completion of Step S6, the photoelectric conversion element 3 is held suspended in the box-shaped frame 5.

In Step S7, the epoxy resin layer 4 is formed. That is, a predetermined quantity of epoxy resin is injected by potting. Therefore, in this operation, no metal mold is used.

The epoxy resin 4 is in liquid phase during potting, thus filing the space from below which is defined by the frame 5 and the photoelectric conversion element 3. The epoxy resin, being in liquid phase, flows into extremely small spaces or gaps, as a result of which no bubbles are formed in the resultant epoxy resin layer 4.

It should be noted that the quantity of epoxy resin 4 to be injected is determined in advance so that the epoxy resin 4 will not flow over the glass plate 2 when injected.

That is, the quantity of epoxy resin 4 to be injected is so determined that the epoxy resin 4 injected surrounds the peripheral vertical side walls of the glass plate 2.

Thus, the vertical side walls of the glass plate, and the part of the lower surface of the latter which part is not in contact with the photoelectric conversion element 3 are in contact with the epoxy resin layer 4.

Under this condition, in Step S8, the epoxy resin is hardened in a furnace at a temperature of 10° C. for instance.

When hardened, the epoxy resin layer 4 becomes flat without a metal mold, thus forming a part of the package to seal the photo-electric conversion element 3.

In this phase, the tie bars of the leads 6 are not cut off yet; that is, the leads 6 are electrically connected to one another.

In Step S9, the tie bars are cut off. In Step S10, a lead forming operation is carried out; that is, the end portions of the leads are bent. Thus, the image sensor 1 has been manufactured.

The image sensor 1 thus manufactured is inspected in Step S11, to determine whether or not it is acceptable.

As is apparent from the above-described series of manufacturing steps, the epoxy resin layer 4, which is a part of the package of the image sensor, is formed by potting; that is, it is formed without a metal mold.

Since the epoxy resin layer 4 is other than the light receiving section of the image sensor 1, it is unnecessary to finish the surface of the epoxy resin layer 4; that is, the epoxy resin layer 4 can be formed by potting and by hardening.

As is apparent from the above description, the employment of the method of the invention makes it unnecessary to use an expensive metal mold and makes it possible to reduce the number of manufacturing steps. Thus, the method contributes to improvement of the working efficiency and to the reduction of the manufacturing cost.

A second method of manufacturing the image sensor according to the invention will be described with reference to FIG. 9. In FIG. 9, those steps which have been described with reference to FIG. 8 are therefore designated by the same step numerals. Thus, in the second method, Steps S1 through S5 are the same as those in the first method described above.

In Step S16, instead of the provision of the cover 11 in the above-described Step S6, the coating with epoxy resin is carried out. Then, in Step S17, the epoxy resin is hardened in a furnace.

Thereafter, the part corresponding to the cover 11 is molded with "Vectra" (phonetic) resin. Then, similarly as in the first method, the operations in Steps S9 through S11 are carried out. Thus, the image sensor has been manufactured.

The above-described methods are for manufacture of the image sensor with the mini flat package.

A variety of packages different in structure are available for semiconductor devices. A chip carrier package can be employed for an image sensor. The technical concept of the invention, concerning the package structure and the method of manufacturing the package, may be applied to the chip carrier package.

Figure 10:
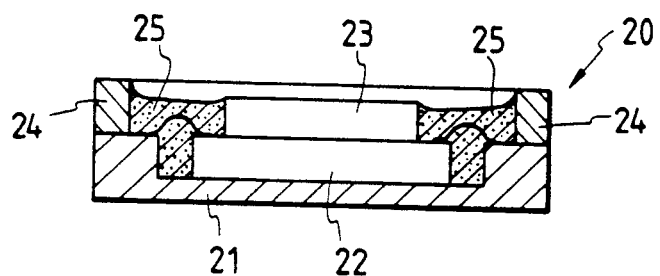
FIG. 10 is a sectional view showing another example of the semiconductor device of the present invention.

FIG. 10 is a sectional view showing one example of an image sensor 20 with a chip carrier package.

In FIG. 10, reference numeral 21 designates a glass epoxy resin substrate having a recess at the center. A photo-electric conversion element 22 is fixedly mounted in the central recess. A glass plate 23 is bonded to the light receiving surface of the element 22.

The epoxy resin substrate 21 is U-shaped in section; that is, its a peripheral portion is protruded upwardly A resin detaining frame 24 is secured to the upper surface of the peripheral portion of the epoxy resin substrate. The glass epoxy substrate 21 and the resin detaining frame 24 form a bottomed box.

The space in the bottomed box is filled with epoxy resin 25, to form an epoxy resin layer in it. The epoxy resin layer (25) thus formed is solidified.

Figure 11:
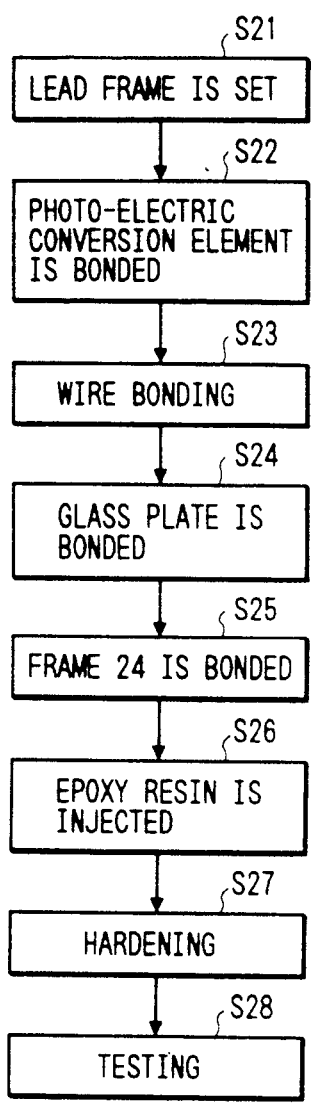
FIG. 11 is a flow chart showing another method of manufacturing the semiconductor device.

The method of manufacturing the chip carrier package will be described with reference to FIG. 11 in more detail.

In Step S21, the glass epoxy resin substrate 21 is set. Then, in Step S22, the photoelectric conversion element 22 is mounted on the glass epoxy resin substrate 21 with a silver (Ag) paste for instance.

Under this condition, the bonding of wires (not shown) is carried out in Step S25. Then, in Step S26, the space in the bottomed box is filled with the epoxy resin 25.

Similarly as in the above-described methods, the injection of the epoxy resin 25 is carried out by potting. After a predetermined quantity of epoxy resin has been injected, the epoxy resin thus injected is hardened in the furnace in Step S27. Thus, the image sensor 20 has been formed The image sensor 20 is tested in Step S28.

As is apparent from the above-description, the package structure and its manufacturing method according to the invention can be applied to chip carrier packages as well as mini flat packages.

In the above-described image sensor 1 and 20, the glass plates 2 and 23 are high in transparency and large in surface hardness. Hence, the glass plates are scarcely scratched, thus being high in reliability.

The peripheral walls of the glass plate 2 and the part of the lower surface of the latter 2 are surrounded by the epoxy resin layer 4. Therefore, paths for allowing water or the like to enter the image sensor to the photoelectric conversion element are scarcely formed along the interface of the glass plate 2 and the epoxy resin layer 4; that is, the image sensor is scarcely affected by water or moisture. Thus, the image sensor formed is high in moisture resistance.

Improvement of the moisture resistance is essential for semiconductor devices as well as image sensors.

Therefore, in order to improve the moisture resistance, the inventors have conducted intensive research on the synthetic resins forming the package, and the package structure as follows.

That is, in order to improve the moisture resistance, a drying agent has been mixed with the epoxy resin 4 or 25 which is to be injected by potting.

The drying agent may be any one which can absorb moisture permeating into the package. For instance, it may be silica gel.

Figure 12:
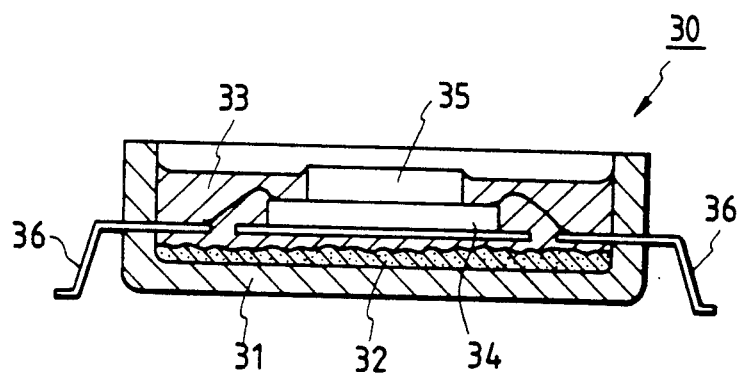
FIGS. 12 and 13 are sectional diagrams showing other examples of the semiconductor device according to the invention which are improved in moisture resistance.

The package structure may be modified as shown in FIG. 12 to improve the moisture resistance. This will be described in more detail.

In an image sensor 30 shown in FIG. 12, its frame 31 is molded from thermoplastic resin such as "Vectra" (phonetic) resin.

A drying agent layer 32 is formed in the recess of the frame 31, and then a layer of epoxy resin 33 is formed on the drying agent layer 32 by potting.

Similarly as in the above-described case, the drying agent layer 31 may be made of silica gel. Furthermore, the drying agent layer 31 may be in powder phase or in solid phase.

Moisture can permeate into the frame 31 of "Vectra" (phonetic) resin more readily than into the epoxy resin layer 33.

However, when moisture permeates into the package through the frame 31, the permeation of moisture is suppressed or stopped at the drying agent layer 32.

Even when moisture permeates into the epoxy resin layer 33, its quantity is greatly reduced by the drying agent layer 32. In addition, since the epoxy resin layer 33 is rather difficult for moisture to permeate, the moisture scarcely reaches the photoelectric conversion element 34.

Similarly as in the above-described embodiments, a glass plate 35 is bonded to the light receiving surface of the photoelectric conversion element 34, and almost all the peripheral vertical side walls of the glass plate 35 are in close contact with the epoxy resin layer 33.

Similarly as in the above-described embodiments, a wire bonding operation is carried out to connect the photo-electric conversion element 34 to leads 36.

In the package thus constructed, moisture permeating in through the frame 31 is at least reduced in quantity by the drying agent layer 31. In addition, it is rather difficult for moisture to permeate the epoxy resin layer 33. Thus, the package is high in moisture resistance as a whole.

Figure 13:
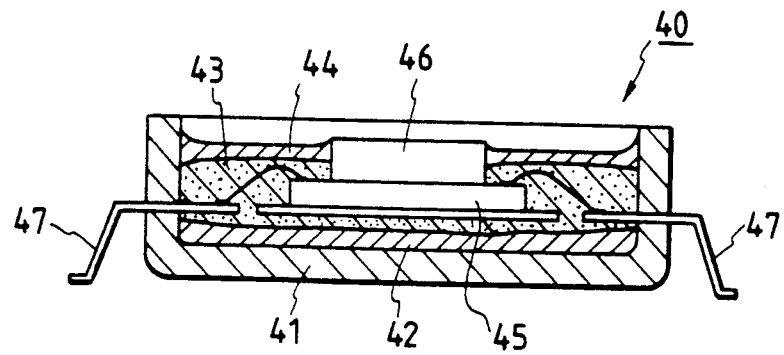

FIG. 13 shows another example of the package structure high in moisture resistance according to the invention.

In an image sensor 40 shown in FIG. 13, its frame 41 is made of "Vectra" (phonetic) resin.

The frame 41 has a recess which is filled with resin to form, for instance, three layers which form part of the package.

Of the three layers, the uppermost and lowermost resin layers 42 and 44 are of the resin into which moisture hardly permeate. The remaining resin layer, namely, the middle resin layer 43 may be of the resin into which moisture can permeate more readily than into the uppermost and lowermost resin layers 42 and 44.

The resin layers 42 and 44 is preferably made of epoxy resin or silicon resin.

Preferably the middle layer 43 is made of three-dimensional-bridged acrylic resin, or epoxy resin or silicon acrylic resin mixed with molecular sieve material such as zeolite.

Further in FIG. 13, reference numeral 45 designates a photo-electric conversion element. A glass plate is bonded to the light receiving surface of the photo-electric conversion element 45, which is connected to leads 47 by wire bonding.

When moisture permeates into the image sensor 40 through the frame 41 which has the above-described package structure, its quantity is reduced by the resin layer 42.

On the other hand, the upper surface of the package, which is in contact with the air containing moisture, is of the resin layer 44 into which moisture hardly permeates. Furthermore, in the case where the resin layer 44 is made of epoxy resin, it adheres to the glass plate sufficiently, and accordingly a moisture permeating path for allowing moisture to flow along the interface of the glass plate 46 is scarcely formed. Thus, the package is improved in moisture resistance.

While the invention has been described with reference to its embodiments, it should be noted that the invention is not limited thereto or thereby; that is, they may be changed or modified in various manners without departing from the spirit of the invention.

For instance, the synthetic resin filled in the package by potting may be colorless and transparent, or may be colored, for instance, black. In the latter case, the quantity of light received through diffraction is reduced.

Furthermore, the transparent member is not limited to the above-described glass plate only; that is, it may be a color filter, or a prism, or it may be made of quartz, calcite, or fluorite, or optical material such as KDP or ADP having an electro-optical effect.

The technical concept of the invention is applicable to a wide range of optical semiconductor devices other than image sensors, more specifically to semiconductor devices such as photo transistor arrays and photo diode arrays which perform photoelectric conversion.

Figure 4:
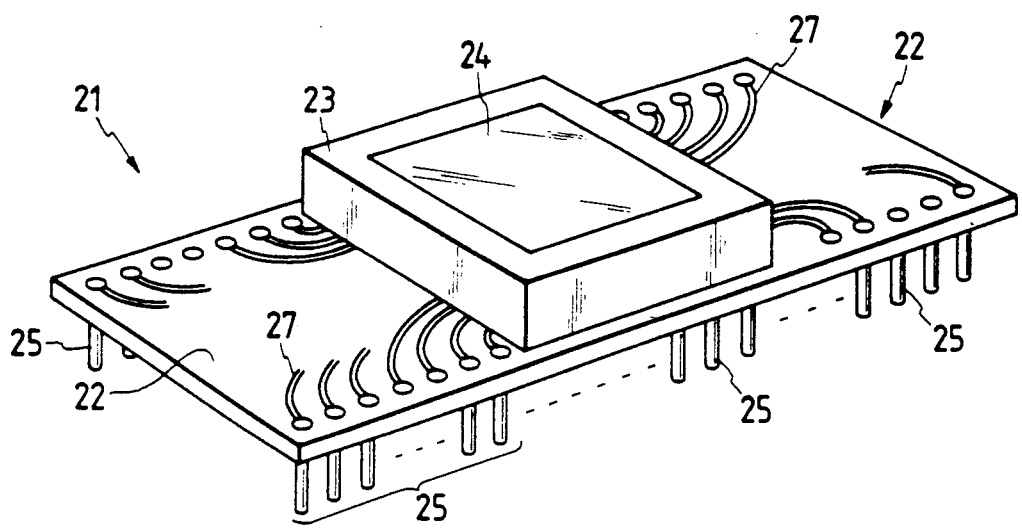
FIG. 4 is a perspective view showing the external appearance and structure of a second embodiment of the solid state image pickup device according to the present invention.
Figure 5:
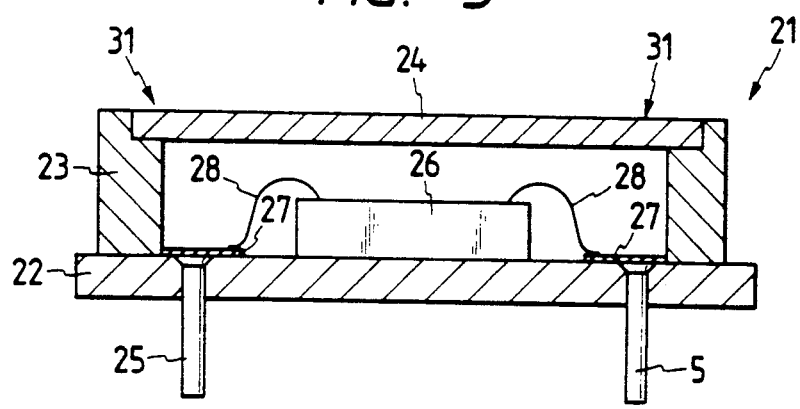
FIGS. 5 and 6 are sectional views of main portions of the inside structure of the solid state image pickup device of FIG. 4.

In the following description of a second embodiment, and referring to FIGS. 4-6, the external configuration and inside structure of an image sensor 21 is first described, and then a device for improving the moisture resistance of the image sensor is described.

The external configuration of the image sensor 21 is provided in a DIP type package, as it is known by those skilled in the art.

First, the external configuration of the image sensor 21 is described. The image sensor 21 is constituted by a frame 23 fixed at a substantially central portion of a copper-plated laminated plate 22 in which a 36 μm or a 18 μm thick copper foil layer is bonded on an insulating plate made of glass cloth in which resin, such as epoxy, is permeated. A glass plate 24 is provided to cover an upper opening portion of the frame 23.

External connection terminals 25 of the image sensor 21 are at predetermined intervals on the wiring substrate 22 at its longitudinal end portions.

Next, the inside structure of the image sensor 21 is described A photoelectric conversion element 26 is fixed on the wiring substrate 22 at a substantially central portion thereof.

Bonding pads (not shown) of the photoelectric conversion element 26 are connected to circuit patterns 27 formed on the wiring substrate 22 through bonding wires 28, respectively.

The circuit patterns 27 are respectively connected to predetermined ones of the external connection terminals 25 to thereby deliver signals between the image sensor 21 and an apparatus on which the image sensor 21 is mounted.

The photoelectric conversion element 26 is electrically and conductively fixed on the circuit patterns, and the external connection terminals 25 connected to the circuit patterns are connected to a predetermined potential to thereby make the photoelectric conversion operation stable.

The frame 23 is made of synthetic resin and metal, and has a shape surrounding the periphery of the photoelectric conversion element 26. The bottom surface of the frame 23 is bonded to the wiring substrate 22 with an adhesive such as epoxy which offers superior moisture resistance and adhesive properties.

Accordingly, the photoelectric conversion element 26 is surrounded by a box-shaped body constituted by the frame 23 and a part of the copper-plated laminated plate 22.

A stepped portion 31 is formed on the frame 23 at its upper opening portion so that the glass plate 24 of a light transmissible material is fitted onto the stepped portion 31.

The glass plate 24 is not only fitted onto the stepped portion, but is bonded to the stepped portion with the adhesive such as epoxy resin which offers superior moisture resistance properties.

Accordingly, a light receiving portion which is light-transmissible through the glass plate 24 is formed on a light reception surface (not shown) formed on the upper surface of the photoelectric conversion element 26 so that a photoelectric conversion operation is performed corresponding to the light incident from the photo receiving portion.

Although glass epoxy or a similar material is used in the copper-plated laminated plate 22, a part of the copper-plated laminated plate 22 is also used as the package of the photoelectric conversion element 26. Therefore, it is preferable to select the material which offers the most superior moisture resistance properties for the copper-plated laminated plate 22.

Figure 6:
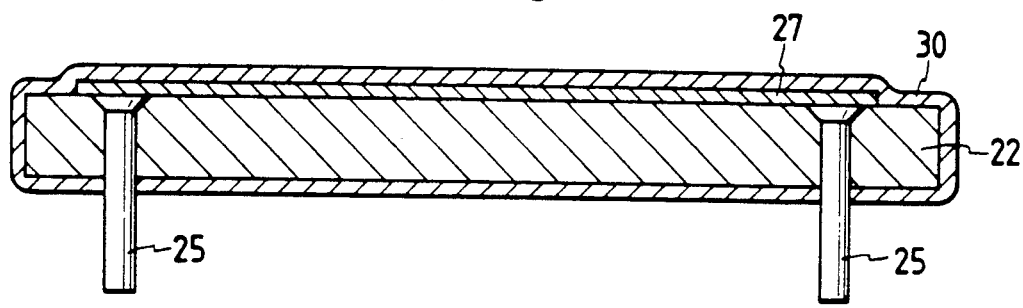

In this embodiment, the whole copper-plated laminated plate 22 is coated with a waterproof film 30, as shown in FIG. 6, so that moisture resistance can be improved not only on the copper-plated laminated plate 22, but also on the whole image sensor 21.

In the image sensor 21, since the intervals between the external connection terminals 25 can be made large, it is possible to reduce signal leakage between the terminals and short circuit in mounting.

Further, in the image sensor 21, it is possible to increase the number of pins while maintaining the widened intervals, for example in a PGA (pin grid array), by additionally providing further external connection terminals 25 at the inner side of the substrate.

The material of the various members constituting the image sensor 21 will be described hereunder.

The copper-plated laminated plate 22 is made of glass epoxy or the like formed on a flat plate. Cooper, an alloy of copper and another conductor, or copper coated with a thin film of nickel, may be used for forming the circuit patterns 27. Further, the copper surface may be plated with solder.

Phosphor bronze or the like may be used for the external connection terminals 25, and the surface of the external connection terminals 25 may be plated with tin or the like.

The frame 23 may be made of synthetic resin or metal, which are integrally formed. Further, the frame 23 formed through machine working may be used.

As epoxy, MALON MEG-165 was used by the inventors.

Although the second embodiment of the present invention has been described above, the present invention is not limited to the described second embodiment, but may be modified. For example, the shape of the copper-plated laminated plate 22 may be modified to be matched to the shape of the apparatus on which the image sensor 21 is mounted.

The frame 23 is not limited to the shape described above but may, for example, be formed in the shape of a plane oval.

In the case where the frame 23 is formed in the shape of plane oval, screw holes are formed in the frame 23 at positions away from the glass plate 24 so that the image sensor 21 itself is directly fixed to, for example, a casing of an electronic camera to thereby improve the mechanical strength. Further, the light transmissible material may be previously provided on the frame which is bonded to the copper-plated laminated plate after elements have been provided thereon. In either case, since the image sensor 21 shown in the embodiment can be manufactured extremely inexpensively in comparison with a ceramic package, and since it can be manufactured by machining, the dimensional accuracy can be greatly improved in comparison with the ceramic package.

Further, little deformation occurs, such as curves in the wiring substrate. Moreover, since phosphor bronze is used for the external connection terminals, the electric resistance can be made low.

Accordingly, an undesired voltage drop can be reduced so that noise is reduced and the signal level is prevented from becoming unduly low.

As described above, in the second embodiment of the solid state image pickup device according to the present invention, the package of the photoelectric conversion element is constituted by a part of a copper-plated laminated plate to which the photoelectric conversion element is fixed. The frame is fixed to the wiring substrate, and the light transmissible member, such as glass, is fixed to the frame.

In the above configuration, the package of the semiconductor device can be constituted without using a number of expensive metal molds, so that semiconductor devices such as image sensors or the like can be extremely inexpensively manufactured regardless of the number of desired products.

Fewer metal molds are used in this embodiment than in molding ceramics, and the metal molds used in the present invention can be produced more inexpensively than those for injection molding. Accordingly, small-quantity production and model change can be made easily, and manufacturing for a small quantity of several varieties of products can be inexpensively performed in accordance with the intended use.

What is claimed is:

1. A method of manufacturing a semiconductor device comprising the steps of:

positioning a semiconductor element inside a frame molded from thermoplastic resin so that a space is formed between said frame and said semiconductor element around the periphery of said semiconductor element;

filling said space with thermosetting resin by potting;

solidifying said thermosetting resin in said space, to thereby form a sealing member for said semiconductor element.

2. A method of manufacturing a solid state image pickup device of the type including a photoelectric conversion element and a glass plate positioned in said device, said method comprising the steps of:

providing a lead frame in a metal mold;

injecting a thermoplastic resin into said metal mold, thereby molding said frame;

bonding a photoelectric conversion element of the type, including a light receiving element to said frame;

wire bonding leads to said frame;

bonding a glass plate to said light receiving surface of said photoelectric conversion element;

covering a lower opening of said frame;

injecting a predetermined quantity of epoxy resin in liquid form by potting;

hardening said epoxy resin, thereby sealing the photoelectric conversion element; and separating and bending said leads.

3. A method of manufacturing a solid state image pickup device of the type including a photoelectric conversion element and a glass plate positioned in said device, said method comprising the steps of:

providing a lead frame in a metal mold;

injecting a thermoplastic resin into said metal mold, thereby molding said frame;

bonding a photoelectric conversion element of the type including a light receiving surface to said frame;

wire bonding leads to said frame;

bonding a glass plate to a light receiving surface of said photoelectric conversion element;

injecting a predetermined quantity of epoxy resin in liquid form by potting;

hardening said epoxy resin, thereby sealing the photoelectric conversion element;

forming a cover on a lower opening of said frame; and separating and bending said leads.

4. A method of manufacturing a solid state image pickup device of the type including a photoelectric conversion element and a glass plate positioned in said device, said method comprising the steps of:

preparing a glass epoxy resin substrate;

mounting a photoelectric conversion element on said glass epoxy resin substrate;

bonding wires to said substrate;

injecting a predetermined quantity of epoxy resin around the periphery of said substrate by potting; and hardening said epoxy resin.

5. The method of claim 4, wherein said epoxy resin is mixed with a drying agent before said epoxy resin is injected by potting.

6. The method of claim 4, wherein said epoxy resin is injected to form three layers, and said uppermost and lowermost resin layers are comprised of resin which is mixed with a drying agent before injection.

* * * * *